United States Patent [19]

Kostelijk

[11] Patent Number: 5,504,691
[45] Date of Patent: Apr. 2, 1996

[54] METHOD AND DEVICE FOR TRACKING DOWN A PRESPECIFIED SUBCIRCUIT IN AN ELECTRICAL CIRCUIT, METHOD FOR CONSTRUCTING INTEGRATED CIRCUIT MASKS USING THE METHOD

[75] Inventor: Anton P. Kostelijk, Eindhoven, Netherlands

[73] Assignee: U.S. Philips Corporation, New York, N.Y.

[21] Appl. No.: 968,611

[22] Filed: Oct. 29, 1992

[30] Foreign Application Priority Data

Nov. 8, 1991 [EP] European Pat. Off. .......... 91202902.2

[51] Int. Cl.$^6$ .................................................. G06F 17/50
[52] U.S. Cl. ........................................... 364/489; 364/488
[58] Field of Search ................................... 364/488, 489, 364/490, 491

[56] References Cited

U.S. PATENT DOCUMENTS 5,278,769  1/1994  Bair et al. ................................ 364/490

OTHER PUBLICATIONS

T. Kostelijk et al., "Automatic Verification of Library–Based IC Designs", IEEE Journal of Solid–State Circuits, vol. 26, No. 3, Mar. 1991, pp. 394–403.
"Dagon: Technology Binding and Local Optimization by DAG Matching" by K. Keutzer, 24th ACM/IEEE Design Automation Conference, 1987, pp. 341–347.
"Cell Libraries and Assembly Tools for Analog/Digital CMOS and BiCOMS Application–Specific Integrated Circuit Design" by Smith et al., IEEE Journal of Solid State Circuit, vol. 24, No. 5, Oct. 1989, pp. 1419–1432.
"Matching a Parts Library in a Silicon Compiler" by Kahrs, IEEE 1986, pp. 169–172.
"Technology Mapping in MIS" by Detjens et al; IEEE Custom Integrated Circuits Conf., 1987, pp. 116–119.
"Design A CMOS Standard Cell Library" by S. Sunter, IEEE Custom Integrated Circuit Conf., 1987, pp. 237–240.
"Hierarchical Functional Verification for Cell–Based Design Styles" by Chen et al., IEE Proceedings, vol. 134, Pt. G, No. 1, Feb. 1987, pp. 103–109.

Primary Examiner—Vincent N. Trans
Attorney, Agent, or Firm—Laurie E. Gathman

[57] ABSTRACT

A method for tracking down a prespecified subcircuit in an electrical circuit equivalent is described. The subcircuit is prespecified by a template circuit comprising a pattern of interconnections between template elements in the template circuit and associated type conditions for each template element. The method comprises the steps of counting, for each associated type condition, a respective occurrence rate of circuit elements in the electrical circuit equivalent which meet the type condition, selecting an initial template element whose type condition corresponds to a lowest occurrence rate, and selecting an initial circuit element meeting the type condition for the initial template element. Subsequently in the electrical circuit equivalent a search is made for successive further circuit elements, coupled to the initial circuit element according to the pattern and satisfying the type conditions for the template elements, until either all template components are identified or persistent failure is met.

8 Claims, 4 Drawing Sheets

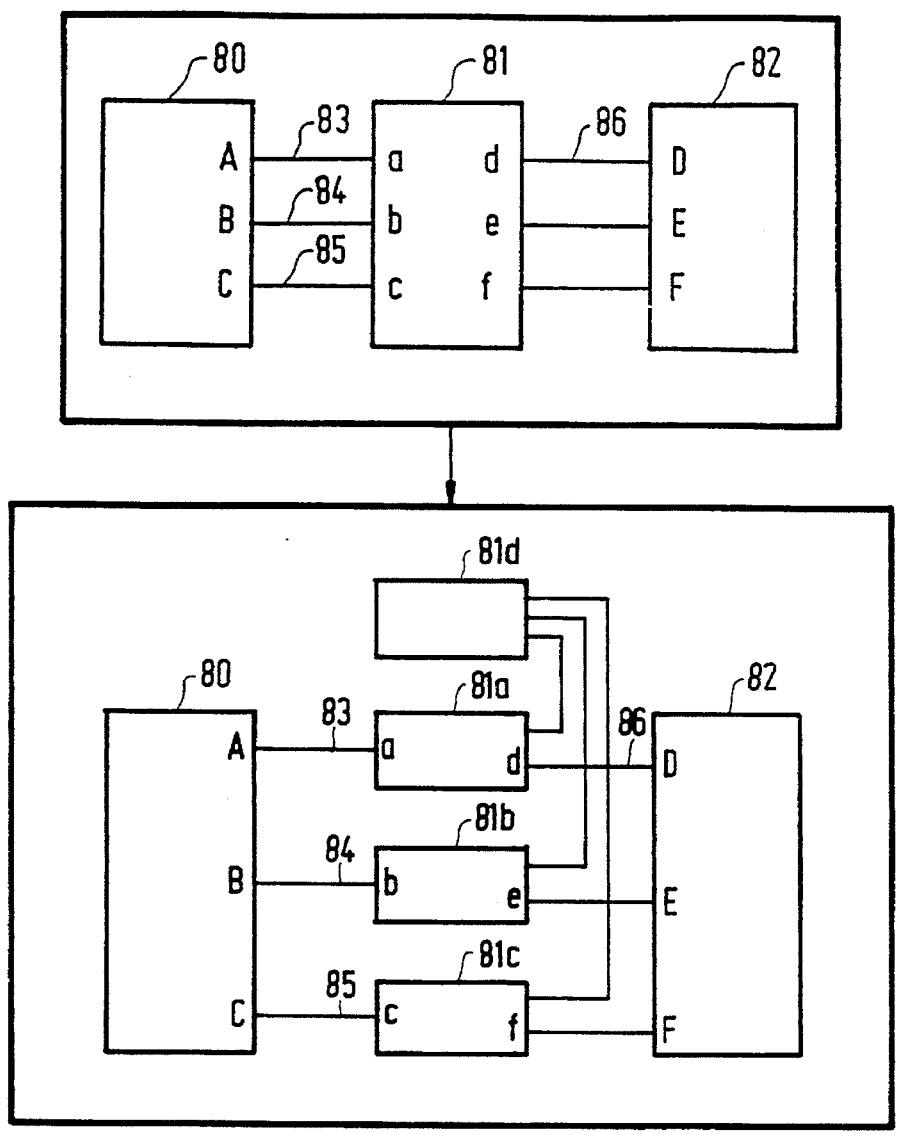
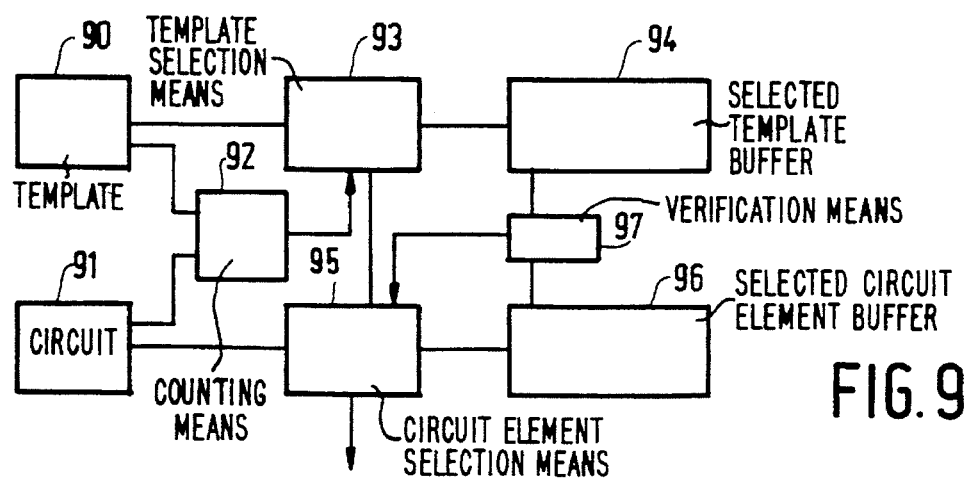
FIG.8
FIG.9

METHOD AND DEVICE FOR TRACKING DOWN A PRESPECIFIED SUBCIRCUIT IN AN ELECTRICAL CIRCUIT, METHOD FOR CONSTRUCTING INTEGRATED CIRCUIT MASKS USING THE METHOD

BACKGROUND OF THE INVENTION

The invention relates to a method of tracking down a prespecified subcircuit in an electrical circuit equivalent, the subcircuit being prespecified by a template circuit comprising a pattern of interconnections between interconnected template elements in the template circuit and associated type conditions for each interconnected template element.

The invention also relates to a method of constructing processing masks for fabrication of an integrated semiconductor circuit, in which a chain of descriptions of an electrical circuit is generated, starting with an initial description in terms of elements and their connections, proceeding with successors in said chain, generated by successive replacement of the elements by subcircuits for implementing the respective functions of the elements, and ending with a layout description generated for the processing masks, under control of which patterns are applied to the processing masks for implementing said functions in the integrated circuit, the method comprising a feedback step for checking said successive replacement, and on the basis of this checking correcting the replacement if necessary, the feedback step comprising starting from an intermediate description from said chain, generating a reconstructed description by substituting effective elements for occurrences of a subcircuit matching a template for the implementation of the effective element, performing said checking by comparing the reconstructed description with a predecessor description, which precedes the intermediate description in the sequence.

The invention also relates to a device for tracking down a prespecified subcircuit in an electrical circuit equivalent, the subcircuit being prespecified by a pattern of interconnections between interconnected template elements and respective type conditions for the interconnected template elements.

Such methods and such a device are known from a publication titled "Automatic verification of library based IC designs" by T. Kostelijk and B. de Loore in the IEEE journal of solid state circuits vol. 26. No. 3, mar. 1991, pages 394 to 403.

Electrical circuits are usually combinations of subcircuits. For example, processor circuits comprise subcircuits like memory cells, adder circuits, multiplexing circuits, logic gates etcetera; radio receiving circuits may comprise amplifier stages, oscillator circuits, mixing circuits, filter circuits, etcetera.

For a number of applications, it is necessary to make automated comparisons between electrical circuits and template circuits. In the process which results in an integrated circuit, for example, there is a chain of many intermediate products, such as system level circuit descriptions, gate level circuit descriptions, transistor level circuit descriptions, layout descriptions, masks etc. which eventually lead to finished chips. The intermediate products in the chain are produced by devices that may produce errors, for example when they require human intervention. Most of todays chips are so complex that it is practically impossible to guarantee that these devices, unchecked, will produce no such errors. Instead, the devices are provided with a feedback mechanism, which matches intermediate products to predecessors in the chain, in order to localize any errors and correct them. To be able to check any intermediate products even when they occur in the context of a larger circuit, it is necessary to detect subcircuits in this larger circuit. Other applications of subcircuit detection include, for example, automated diagnosis and repair of faulty circuits, or detection of subcircuits that infringe some patent.

According to the abovementioned publication, a template provides specifications of subcircuits which must be tracked down in the electrical circuit, or any description equivalent to it. If one of its subcircuits is to meet a specification, the electrical circuit equivalent must contain elements that match template elements. The elements include physical components, like for example transistors, resistors, AND gates, registers etcetera. As the word "elements" is intended here, the elements of the template and circuit may also include input terminals, power supply terminals, and in general any interconnection wiring between physical components.

For each template element, the template comprises a type condition, which specifies of what type a circuit element should be to be match the template element (e.g. "P type transistor", "power supply node", "wiring connected to output of AND gate and input of inverter"). In addition, the type condition may also specify a range for the parameters of a circuit element (e.g. "P transistor with width between 10 and 20 micron, and length between 1 and 2 micron", "resistor between 10 and 1000 ohm" etcetera). Moreover, the template comprises a pattern of interconnections between the template elements to which the interconnections in the circuit must correspond if they are to identified as the prespecified subcircuit.

As an example, the type conditions for elements of the template circuit shown in FIG. 1 are element C1: two input AND gate element C2 and C3: a first and second inverter, element N1: node connected at least to input of AND gate, element N2: node connected to output of AND gate and input of inverter, element N3: output node connected to output of inverter, input of inverter and input of AND gate element N4: node connected at least to output of inverter, The connection conditions require connections from N1 to an input of C1, from the output of C1 to N2, from N2 to the input of C2, from the output of C2 to N3, from N3 to an input of C1, from N3 to the input of C3, from the output of C3 to N4, In addition, parameter ranges (like fan-out of C2 between 2 and 3) may be specified for the elements in the type conditions.

According to the above-mentioned publication, when a prespecified subcircuit is tracked down in an electrical circuit equivalent one starts by considering an initial template element (e.g. C1 from FIG. 1) and selects an initial circuit element (e.g. an AND gate) from the electrical circuit, for which it is verified that it matches the type condition for the initial template element. Subsequently, second, third etc.

circuit elements are chosen which must correspond to a second, third etc. template element (e.g. C2, C3 etc.). After each selection, it is verified that the selected circuit element meets the type condition for the corresponding template element. For each further selected circuit element after the first circuit element, it is moreover verified that the selected circuit element satisfies the interconnection pattern as far as this pattern concerns earlier selected circuit elements; when a further circuit element fails this verification, one tracks back on the selection of the circuit elements, and tries a new selection until all template components have been identified, which means that the subcircuit has been found.

In principle, many possible combinations of elements of the circuit have to be selected and verified. The problem with this method of tracking down the subcircuit is therefore that, especially when tracking down a subcircuit in a much larger electrical circuit, the risk exists that very many possible combinations of circuit elements need to be searched which do not yield subcircuit detection. Depending on the number of other subcircuits used in the circuit, and particularly those only partially matching the template, this can make the method expensive and slow in terms of computation time required for search with all but the simplest templates and small circuits.

SUMMARY OF THE INVENTION

Amongst others, it is an object of the method according to the invention to reduce computation time needed track down a subcircuit in a larger circuit.

According to one of its aspects, the method according to the invention realizes the object because it is characterized, in that it comprises the steps of

- counting, for each particular associated type condition, a respective occurrence rate of circuit elements in the electrical circuit equivalent which meet the type condition,
- selecting an initial template element whose type condition corresponds to a lowest occurrence rate,
- selecting an initial circuit element meeting the type condition for the initial template element,
- searching, in the electrical circuit equivalent, for successive further circuit elements, interconnected to the initial circuit element according to the pattern and satisfying the type conditions for the template elements, until either all template elements are identified or persistent failure is met.

In this way, the sequence in which template elements are identified with circuit elements is adapted to the electrical circuit in which the subcircuit is tracked down. The adaptation, as it is effected by the selection of the initial template element according to occurrence rate, is used as an instrument to reduce the number of circuit element selections which need to be followed by further searching and thereby the amount of work needed to track down the prespecified subcircuit.

The observed occurrence rates can vary over many orders of magnitude between different template elements. Of course, the reduction in the amount of work is achieved even if the selected initial template element does not have strictly the lowest occurrence rate. The important point is that the selection of the initial template element is under control of the occurrence rate. Choices other than the strictly lowest occurrence rate within a factor of approximately two from the strictly lowest occurrence rate will also achieve the object of reducing the amount of work to an acceptable level. This range of occurrence rates is what is meant by the designation of "a lowest" occurrence rate.

An embodiment of the method according to the invention is characterized, in that it comprises incrementally constructing a sequence of template elements, starting with the initial template element, a succeeding template element in the sequence, which follows a leading group in the sequence, being chosen under a restriction that, according to the pattern, it is interconnected to the leading group, and in that successively in the order of the sequence, for each template element an associated further circuit element is selected, meeting its associated type condition, and having an interconnection to a precedingly selected circuit element according to the pattern. In this way, the sequence of template elements coupled to the initial template element is used to control the order of searching for circuit elements.

An embodiment of the method according to the invention is characterized, in that when said restriction leaves a choice, the choice of the succeeding template element is codetermined by its having lowest occurrence rate of corresponding circuit elements. In this way the pan of the sequence following the initial template element is also adapted to the occurrence rate in the electrical circuit equivalent, reducing the number of further searches required after selecting a next circuit element to correspond with the next template element.

An embodiment of the method according to the invention is characterized, in that, before choosing the succeeding template elements, the occurrence rates for the template elements are readjusted by eliminating from said occurrence rate occurrences of a further leading group comprising the associated further circuit elements, and in that the occurrences are restricted to circuit elements connected to the further leading group. In this way, the order of identification is adapted dynamically, taking account of the part of the subcircuit which has already been tracked down tentatively.

An embodiment of the method according to the invention is characterized, in that when said restriction leaves a choice, the choice of the succeeding template element is codetermined by its having a highest connection count of connections in the pattern connecting the succeeding template element to the leading group. A higher connection number implies a more restrictive condition and therefore fewer later erroneous element identifications needing frustrated further search for circuit elements. It therefore serves to reduce the amount of work required in tracking down the subcircuit.

An embodiment of the method according to the invention is characterized, in that when said restriction leaves a choice, the choice of the succeeding template element is codetermined by its having a lowest parallelism count of template elements which have identical type conditions as the template element for which the parallelism count holds, and identical interconnections to the leading group in the pattern. Groups of elements that have identical type conditions and an identical connection pattern to template elements in the leading group are connected in parallel to the leading group. Parallelism allows identification of parallel template and circuit elements in any permuted order. Postponement of identification of such parallel elements until the parallelism is removed by other connections will reduce the required number of element identifications that needs to be considered.

BRIEF DESCRIPTION OF THE DRAWING

The invention will be further described using a number of Figures, of which

FIG. 8 illustrates a template circuit in which components with permutable groups of terminals may give rise to a large amount of search FIG. 9 shows an exemplary apparatus for executing the method according to the invention.

DETAILED DESCRIPTION OF THE PREFERRED EMBODIMENTS

Figure 1:
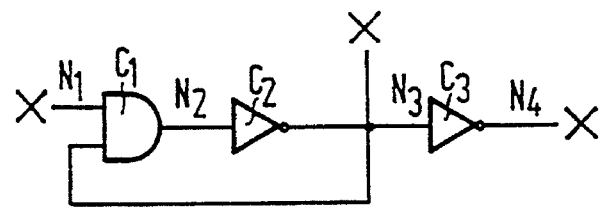
FIG. 1 represents a template of a subcircuit

In a number of applications, it is necessary to make automated comparisons of electrical circuits with template circuits. In the construction of an integrated circuit, for example, there is a chain of many intermediate products, such as system level circuit descriptions, gate level circuit descriptions, transistor level circuit descriptions, layout descriptions, masks etc. which eventually leads to finished chips. The intermediate products in the chain are produced by devices that may produce errors, for example when they require human intervention. Most of days chips are so complex that it is practically impossible to guarantee that these devices, unchecked, will produce no such errors. Instead, the devices are provided with a feedback mechanism, which matches intermediate products to predecessors in the chain, in order to localize any errors and correct them.

In a publication titled "Automatic verification of library based IC designs" by T. Kostelijk and B. de Loore in the IEEE journal of solid state circuits vol. 26. No. 3, march 1991, pages 394 to 403, a method is disclosed for matching an intermediate or final circuit description with a predecessor in the chain. This method starts by identifying individual elements, such as transistors. This method then searches for occurrences of small standard subcircuits composed of interconnected circuit elements which implement structured elements, such as logic gates, latches, multiplexers etcetera. When such occurrences of structured elements are detected, the structured element is substituted for the subcircuit. Subsequently, the circuit with substitutions is compared to a predecessor in the chain.

Indirect comparison, that is, via subcircuits rather than directly using a description of the entire circuit, has several advantages. First of all, it is also useful when only part of the intermediate circuit must be checked, and it is not possible to isolate this part beforehand. Furthermore, it provides better localization of errors, i.e. it pins them down to subcircuits rather than in the whole circuit. Moreover, description in terms of subcircuits, which corresponds to the human way of thinking about circuits also makes the checking result amenable to human inspection.

Furthermore, the use of indirect matching can also reduce the amount of work needed; to implement the method it is necessary to match subcircuits to templates. Matching is a trial and error process: the known method selects each time a template element and hypothesizes a match to a circuit element. If, in further analysis, it turns out that such an hypothesis is incorrect, another hypothesis must be tried. By using templates for repeatedly occurring standard subcircuits with a small number of elements, instead of one for the whole circuit with a large number of elements, the frequency of incorrect hypotheses is reduced.

In other applications, such as for example in automated diagnosis and/or repair devices, in circuit copying devices, tracking down of standard subcircuits is used to develop an understanding of the functions of the circuit, which makes it possible for example to replace subcircuits by off the shelf equivalents and to pinpoint faults.

A method of tracking down subcircuits will be discussed below using FIG. 1 which illustrates, a by way of example, a very small subcircuit for which a template will be defined. This subcircuit comprises a number of elements. The elements are physical components such as, for example, inverters C2, C3. Moreover, as it will be used here, the word "element" will also refer to the circuit nodes between transistors; so for example, the nodes N1, N2, N3 etc. will also be referred to as elements. The crosses X mark input and output nodes. In an occurrence of the subcircuit any further elements may be attached to the input and outputs, but the nodes which are not marked as input and outputs should have exactly the connections given for the subcircuit.

For the subcircuit a template is formed, which comprises a set of template elements that should be identified in the circuit in order to detect an occurrence of a circuit instantiating the template. The template also comprises conditions on the type and parameters of the elements such as "two input AND gate" and a relations which the parameters should satisfy, such as "fan-out between 2 and 5". The template moreover comprises a pattern of interconnections, which specifies the way the elements in the template should be connected. For example for the subcircuit of FIG. 1, the set of template elements and the type conditions are described by 1 C1: two input AND gate with fan-out <2

2. C2: inverter,

3. C3: inverter,

4. N1: node connected at least to input of AND gate,

5. N2: node connected to output of AND gate and input of inverter,

6. N3: node connected at least to output of inverter, input of inverter and input of
AND gate 7. N4: node connected at least to output of inverter, The amount of detail in each type condition may be varied; for example, more of the properties of the elements to which node component are connected may be specified. Such further information is not indispensable for matching, but may reduce the amount of work needed for matching.

The pattern of interconnections may be specified as

1. N1 to an input of C1, 2. output of C1 to N2,

3. N2 to the input of C2, 4. output of C2 to N3,

5. N3 to an input of C1,

6. N3 to the input of C3, 7. output of C3 to N4

The subcircuit of FIG. 1 is of course but an example. Other circuits may be described in a similar way, and different types of elements, and elements which either constitute (e.g. transistors) or comprise (e.g. registers) gates or larger components may also be used.

Figure 2:
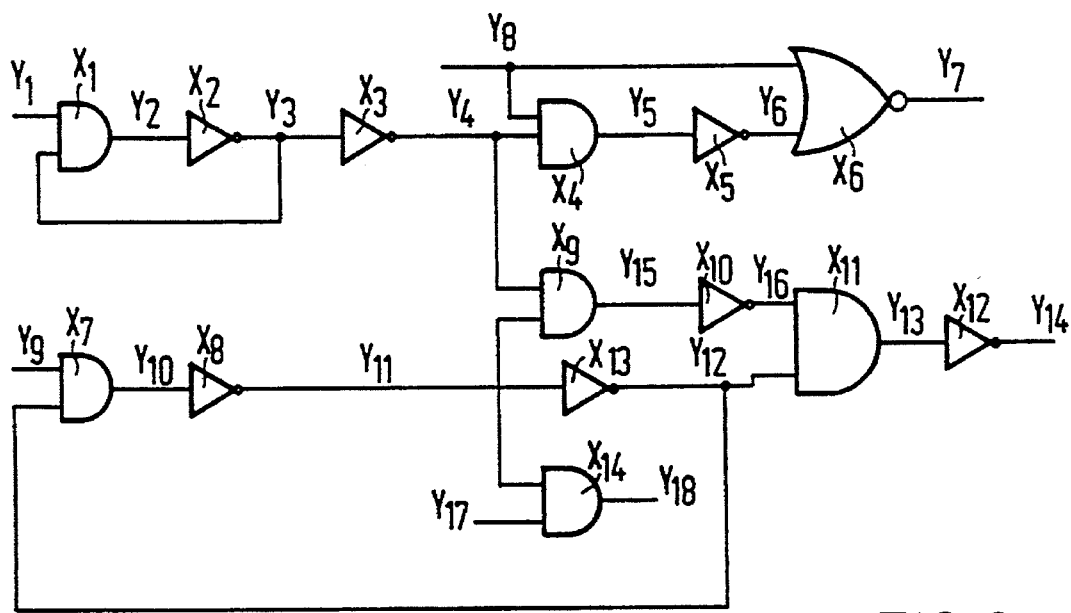
FIG. 2 provides an example of a first electric circuit
Figure 3:
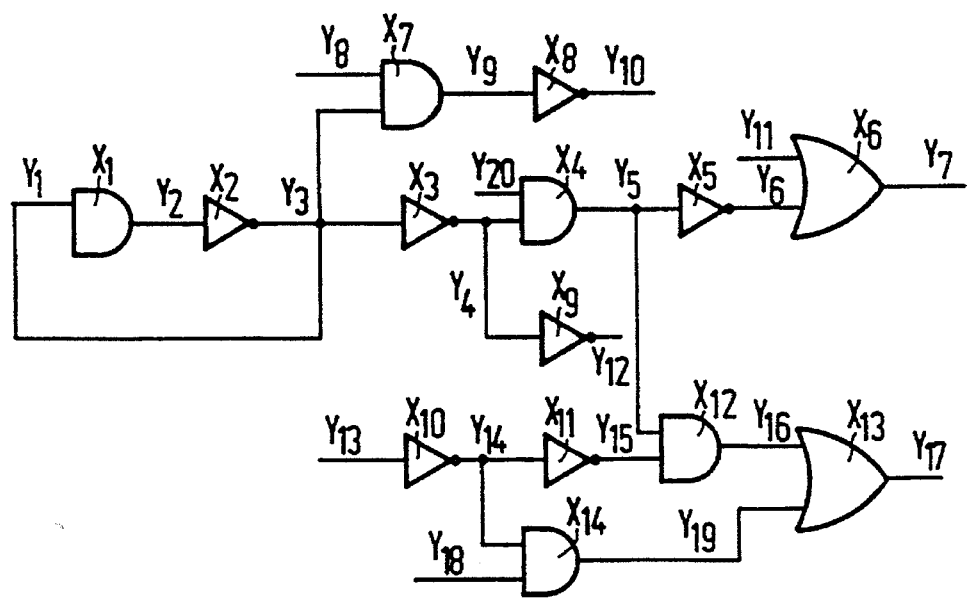
FIG. 3 provides an example of a second electric circuit

The problem addressed by the method according to the invention is to detect subcircuits of a larger electrical circuit which match this template. FIGS. 2 and 3 provide examples of such larger circuits.

These circuits may also be described by a list of elements, with a description of the type and parameters of each element. For gates this description comprises the fact that they are for example AND, OR, NOR, NOT gates and their parameters (fan-out etc.). Other descriptions will for example be expressed in terms of transistors, their type (P-type, N-type), their geometry (width, length) etcetera. For resistors this comprises the fact that they are resistors, and their resistance value.

For node type elements, the description of type and parameters comprise at least the fact that they are nodes, the type of the elements to which they are connected and the input to which they are connected.

The circuit description also comprises a list of connections, each connection identifying the elements which it connects. The connection description also comprises an identification of the terminal of the physical component to which the connection goes; for logic gates this refers to input/output; in the case of a MOS transistor, this may be for example refer to the gate or the channel (source/drain).

When instances of the template are sought in the circuit, one follows a sequence of steps. In each step, a circuit element is selected which meets the type and parameter condition imposed for a template element and it is verified that the selected circuit element has the interconnections specified in the pattern, as far as they concern elements selected in earlier steps. When all template elements have a corresponding selected and verified circuit element, the occurrence of a subcircuit matching the template is detected.

In principle, there are many possible combinations of circuit elements that need to be considered. Usually, this is not done by running all steps separately for each combination, but rather by sharing the earlier steps for combinations in which the corresponding earlier identified circuit elements are identical.

This process will be described using the flow chart displayed in FIG. 4. In the initializing step 30, which will be described in more detail below, the individual template elements are taken from the template and placed in a numbered sequence; when discussing steps in the flow chart, a template element at number j will be referred to as TC(j). The order of numbering of the template elements will be discussed below; for the present, it suffices to assume that it has been fixed in the initializing step. After this step, the flow chart describes a succession of searching steps 31, 32, 33, . . . 34. In each of these searching steps a different template element is identified with a circuit element. There will be as many steps as there are template elements. Several searching steps are not indicated in FIG. 4 but symbolized by the dots between the third step 33 and the last, Mth, step 34.

Figure 4:
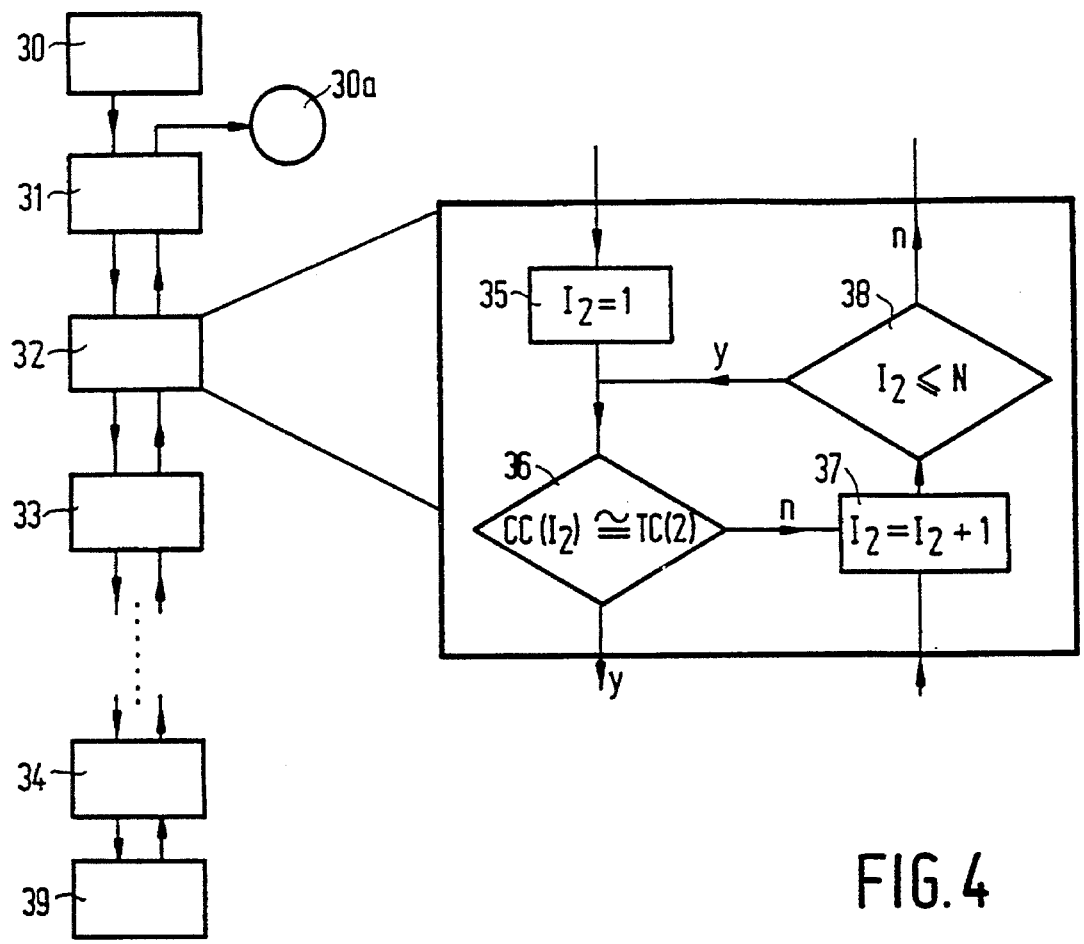
FIG. 4 shows a flow chart for detection of a subcircuit

Each searching step has a similar structure, and a simplified version of this structure is detailed for step 2 in FIG. 4 (32). Upon entry to the step, an index $I_2$, which points into a list of circuit elements CC is initialized. After that, it is tested whether the circuit element $CC(I_2)$ pointed at meets the conditions for the template element TC(2) corresponding to the second step. This test involves a test that the circuit element is not used in an earlier step, a test upon the conditions for the type of the circuit element and its parameters, and a test upon the connection pattern linking it to circuit elements selected in earlier steps. This test is symbolized by a diamond 36 in FIG. 4. If the circuit element meets the test, (y), the (flow), chart continues towards the next step. If the circuit element does not meet the test, (R) the index $I_2$ is increased (37) and if (38) it still points into the list of elements TC the next element on the list is tried. If, on the other hand, the index is outside the list, the flow chart returns control to the previous step, which means that the circuit element selection made in that step will be backtracked. In receiving control from the next step, backtracking is effected by increasing (37) the index and testing (38) it.

All of the searching steps 31, 32, 34 in FIG. 4 and the searching steps symbolized by the dots have the same structure, except of course that the subscript "2" of the index $I_2$ is replaced by the appropriate step number and the test 37 involves the template element TC appropriate to the step. When the exit of the last searching step 34 is reached, this means that a subcircuit has been tracked down in the circuit. This is reported, or otherwise used in a report stage 39.

In principle, this completes the tracking down process. When more than one subcircuit must be found in the electrical circuit, control is transferred back to the last searching step 34 as shown in FIG. 4. If no partially overlapping subcircuits are to be expected, control may instead be transferred back directly to the first search step 31. The search process then continues, When eventually the first searching step 31 transfers control back to the termination 30a, all subcircuits, if any, will have been found and handled by the report step 39.

The version of the second searching step 32 shown in FIG. 4 is simplified for the purpose of explanation. In particular in a preferred mode of implementing the method, the index $I_2$ will be used only when the template element of the step is not connected to any template element of a previous step. If there is a connection, then instead of using the index to search all circuit elements, one will use connections to element selected in earlier steps. The connections are represented in the circuit description and point to a much restricted number of relevant circuit elements that needs to be considered.

Figure 5:
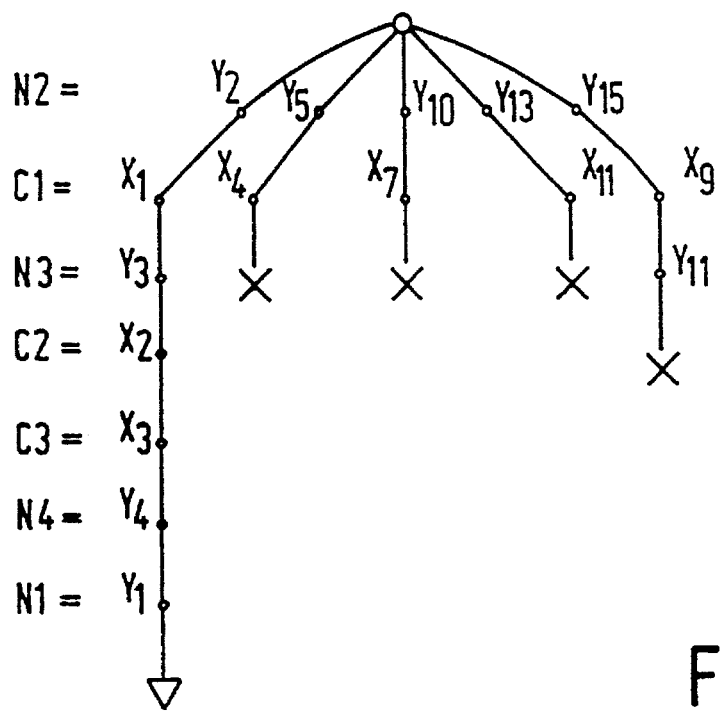
FIG. 5 provides a tree shaped representation of a first search for occurrences of a subcircuit FIG. 6 provides a tree shaped representation of a second search for occurrences of a subcircuit

By traversing all possible values for the indices I1, I2, etc. the flow chart shown in FIG. 4 will traverse all possible instances of the template in the subcircuit. This traversal is illustrated using a tree, as shown in FIG. 5 for the template of FIG. 1 and the circuit of FIG. 2. This Figure represents a tree with a root 50, and a number of levels marked by "N2=", "C1=" etc. The root corresponds to the first step 31 of the localization process. Each level "N2=", "C1=" etc. corresponds to a step 32, 33, . . . 34 labelled with the specific template element which is identified with a circuit element (in the example the levels correspond to N2, C1, N3 etc of FIG. 1). Each branch at the root represents an alternative circuit element (Y2, Y5, Y10, Y13, Y15 of FIG. 2) which meets the type conditions of the template element (N2) at the first level "N2_32 " The index values causing flow to continue through the "y" output of the test diamond 37 of the first step 31 therefore correspond to Y2, Y5, Y10, Y13, Y15.

Each path through the tree from the root to a leaf, at the lowest level, as marked by the triangle, corresponds to a sequence of steps in which circuit elements have been identified for all template elements. Leaves of the tree at a higher level, marked by X, correspond to dead ends, where a combination of identifications obtained in earlier steps could not be continued with a further identification, i.e. where the exit "n" of the test 38 was taken without finding a suitable index. The flow chart of FIG. 4 will traverse this tree depth first, stepping back once all the forks of some branch have been traversed.

For most practical circuits, the number of branches (the branch rate) at the root and also at other levels may be quite high. Since the number of leaf branches of the tree that must be visited is a product of the branch rates at preceding levels, high branch rates may give rise to substantial computational effort in detecting occurrences of subcircuit matching the template. The part of this effort which corresponds to dead ends does not lead to detection.

According to the invention, a reduction in the number of circuit components that needs to be selected during so, arch will be achieved because of the way in which in the initializing step 30 the order in which the template elements are considered in the sequence of searching steps is adjusted, i.e. through assigning numbers to the template elements, as for example TC(1)=N1, TC(2)=C1, etc.

According to the invention, the first template element in the order is selected according to lowest occurrence rate $N_j$ of circuit elements that meets the type and parameter conditions for the template element j. For the template elements of the template of FIG. 1, as counted for the circuit of FIG. 2 these occurrence rates are $$\begin{array}{ccccccc} & C1 & C2 & C3 & N1 & N2 & N3 & N4 \\ N_j = & 6 & 7 & 7 & 8 & 5 & 2 & 7 \end{array}$$

(In principle, the occurrence rates $N_j$ can be calculated for each template element, but it may be advantageous to place template elements with identical type conditions, such as for example C2 and C3, in a group (C2,C3) and do the counting only once for each group. Moreover, for some elements for which it may be assumed in advance that they will not have a lowest occurrence rate counting may be omitted altogether).

According to the invention, therefore, when searching for an occurrence of a subcircuit of FIG. 2 matching the template of FIG. 1, one will select N3 as the first template element in the order. In one embodiment of the invention, the successors in the order are also selected according to lowest occurrence rate, but with the restriction that they are coupled to preceding template elements in the order. When searching for an occurrence of a subcircuit of FIG. 2 matching the template of FIG. 1, therefore a possible order is

N3 C1 N2 C2 C3 N4 N1

(C2 and C3, which have the same occurrence rate may be permuted).

Figure 6:
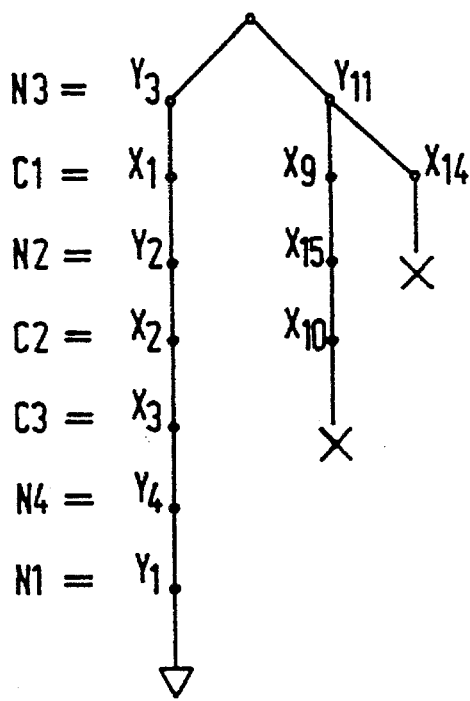

The search tree which results from this order is shown in FIG. 6. One should note that by using the method according to the invention the order of the template elements depends on the circuit in which occurrences of subcircuits are sought. For the circuit of FIG. 3, the order would be different from that for FIG. 2: in FIG. 3 the occurrence rates are

C1 C2 C3 N1 N2 N3 N4 5 7 7 9 2 3 7 and an order according to the invention for this circuit is

N2 C1 N3 C2 C3 N4 N1

The search tree which results when this order is applied to the circuit of FIG. 2, i.e. a circuit for which it was not selected, is in fact the search tree of FIG. 5. The amount of work involved, as measured by the number of nodes (including unsuccessful leaf nodes, but not including the root node) in the search tree of FIG. 5 is 20; for FIG. 6 it is 14. The improvement, from 20 to 14, has been achieved by using the order selected according to the invention. This improvement is primarily due, in this example, to a reduction of the branch rate at the root node of the tree.

In several embodiments of the invention, which will be discussed below, the selection of the order of the template elements is further refined. For this purpose, a weight function is introduced which is predictive of, or at least monotonously dependent on, the amount of work expected when a template element would be selected to be next in the succession. The template element with the lowest weight value is used next in the order.

In an embodiment of the invention, the weight function is an increasing function of the number of circuit elements $N_3$ that meets the type and parameter conditions for the template element j. An example of a weight function that satisfies this is $$F_j = CN_j$$

In this way, the branch rate of the tree (FIG. 5/6) is reduced. Because many potential identifications of circuit elements will fail in the early steps of the identification process, i.e. at the nodes closest to the root, this will reduce the number of identifications that has to be tried at all.

The order described above:

N3 C1 N2 C2 C3 N4 N1 was selected according to this criterion.

In embodiments of the invention, the weight function is further refined to take account of special circuit configurations which are relevant to the number of potential element identifications.

In one of these embodiments, the weight function is made a decreasing function of the number of connections in the connection pattern, $N_{cj}$, which link each template element (j) to the template element selected for earlier steps, for example by using the following weight function $$F_j = C'N_j/N_{cj}$$

Once more, this will lead to a reduction of the number of forking branches in each step at the levels near the root. As an example, the template of FIG. 1 is considered. Suppose the elements C1, N2, C2 have been selected for earlier steps, then the number connections for each of the remaining elements is given by $$\begin{array}{ccccc} & C3 & N1 & N3 & N4 \\ N_{cj} = & 1 & 1 & 2 & 0 \end{array}$$

In this case, N3 will therefore be selected sooner.

Figure 7:
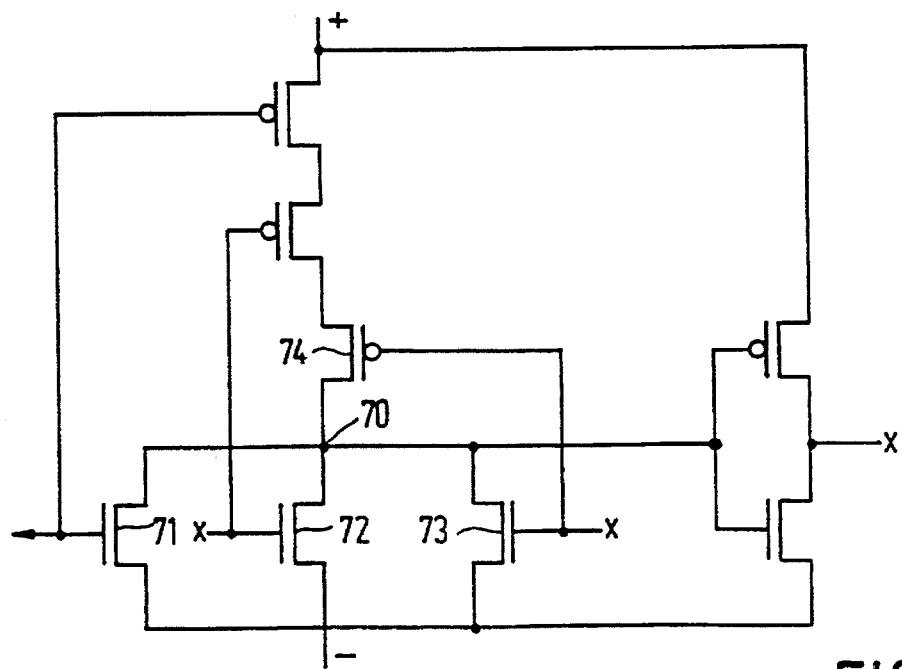
FIG. 7 illustrates a template circuit in which parallel components may give rise to a large amount of search

Another embodiment of the method according to the invention takes account of parallelism. The concept of parallelism is illustrated in the template of FIG. 7. Suppose that the node 70 has been selected as template element in an earlier step, but none of the transistors 71, 72, 73, 74 have been selected. In that case elements 71, 72, 73 are identical and connected in parallel, at least as far as their connection conditions to the earlier selected elements 70 are concerned. Consequently, when a subcircuit matching the template occurs, all permutations of transistors identifications would be possible if the parallel elements 71, 72, 73 would be selected for subsequent steps. For example, if the template elements 71, 72, 73 are selected in succession, and the electrical circuit comprises corresponding circuit elements C71, C72, C73, then the identifications

71=C71 72=C72 73=C73

71=C72 72 =C73 73 =C71

71=C73 72 =C71 73 =C72

71=C72 72=C71 73=C73

71=C71 72=C73 73=C72

71=C73 72=C72 73=C71 all need to be considered. In general, if there are N parallel elements, this multiplies the number of branches of the tree that needs to be considered by N!. To avoid this increase, selection of elements which are parallel in this sense should be delayed.

This can be effected by ensuring that the weight function is an increasing function of $N_{pj}$, the number of elements that are connected in parallel to a template element j in the sense defined above. ($N_{pj}$ includes the template element j itself, so it is at least 1 ). The weight function may for example be $$F_j = C'' N_j N_{pj} / N_{cj}$$

For example, in FIG. 7, once element 70 has been selected, the $N_j$ for elements 71, 72, 73 equals 3, but for the P type transistor 74, it equals 1. Consequently, other things being equal, the P type transistor 74 will be selected earlier in the order of template elements. Once it and the node connected to its gate are selected, the transistor 73 is no longer parallel to the transistors 71 and 72, in the sense that their connections pattern to earlier selected template elements is not identical, the gates of the transistors 73, 74 being connected. Therefore, other things being equal, transistor 73 will now be selected earlier in the order of template elements than the other two transistors 71, 72.

Some care must be taken when the components are connected to different terminals of a single component. If these terminals may be permuted without affecting the function of the single component (e.g. two inputs of an AND gate), any elements which are parallel except that they are connected to different, but permutable, terminals of other elements, will also count as parallel.

One can even account for elements with permutable groups of terminals. In the example of FIG. 8, block 88a contains three physical elements 80, 81, 82 which are coupled together. In the example, the middle element 81 is a triple line driver, connecting the three outputs A, B, C respectively to the three inputs D, E, F. The terminal pairs a-d, b-e, c-f, each corresponding to the input and output of one line driver, may be permuted without affecting the function of the element 81; these pairs constitute an example of permutable groups of terminals.

Since the groups of terminals may be freely permuted, if there are N such groups, they may give rise to N! possible identifications of the terminal connections: once template element 81 has been selected in the order of template elements, any permutation of its groups of terminals will yield the same circuit function, but a different identification to circuit elements.

This problem is similar to that of parallelism, as is shown by the equivalent circuit substitute 88b. Here, each a separate component 81a, 81b, 81c is introduced for each group of terminals, and a master component 81d is introduced in order to represent the relation between the separate components fit should be noted that the introduction of separate components is for illustration purposes and is purely formal: they do not necessarily correspond to real separate subcomponents). When this circuit substitute 88b is treated according to the rule for parallelism given above, it will be clear that after selection of, say, 81a, 81d and their connecting node 87a, selection of the nodes 87b, 87c connecting to the parallel components 81b 81c will be delayed, other things being equal, due to their parallelism. This will reduce the number of required identifications.

However, the same reduction may also be attained without the explicit introduction of the separate components. For this purpose, template element are also counted as parallel when they are connected to corresponding terminals of different but permutable groups of terminals, provided the other terminals of these groups are not connected yet to any earlier selected template element.

In principle, the weight function can be evaluated for all template elements before any identification of template elements with circuit elements. The order of the template elements in the sequence of steps may be determined from this evaluation also before any identification. However, it is also possible to readjust the weight function after each successive step. Thus, account can be taken of the circuit elements that have been identified; for example by discounting used elements in tile occurrence rate or by imposing that the counting of the occurrence rate is restricted to circuit components which are connected to earlier selected circuit components. Such readjustment leads to dynamic selection of the order of the template elements, adaptive to the circuit elements identified in earlier steps. This, however, at the expensive of more evaluations.

According to the invention, the order of the template elements in the successive identification steps is used as an instrument to reduce the amount of work. This is done either statically, i.e. before any circuit element has been identified with a circuit element, or dynamically during the identification. Thus, the number of identifications of circuit elements is reduced, and thereby the amount of time required to localize the instances of a template for a subcircuit in a an observed circuit. It will be clear that this is already achieved by using any single one of the numbers $N_{cj}$, $N_j$, $N_{pj}$, and more so by any combination of two or more of these numbers. Moreover, it will be clear that the invention is not restricted to the example of the weight function given above. Any function which increases or decreases as appropriate, in response to combinations of the numbers $N_{cj}$, $N_j$, $N_{pj}$ suffices. One may for example use powers of these numbers in the formulas above.

Nor is the invention restricted by any of the circuit examples: it will be clear that any level of circuit description, be it in terms of transistors, logic gates, or any larger groups of elements can be used in the template and in the circuit. Nor is the method restricted to construction of logic or MOS circuits or to integrated circuits: it can also be used in methods for the construction of integrated circuit boards.

FIG. 9 shows an exemplary apparatus for executing the method according to the invention. This apparatus comprises means 90 91 for holding a representation of the template and the circuit respectively. The template and circuit representation are coupled to counting means 92, for counting respective numbers of circuit elements received from the circuit representation means 91, which meet type conditions received from the template representation means 90. The numbers counted represent the occurrence rate, and are fed by the counting means to template selection means 93. These select an initial template element with a lowest occurrence rate and feed this to a selected template buffer 94.

The exemplary apparatus also comprises circuit element selection means 95, which select circuit elements received from the circuit representation means 91, and feed the selected circuit elements to a selected circuit element buffer 96. The two buffers 94, 96 retain all selected elements (from the template and circuit respectively) in a parallel shift register structure into which elements can be pushed, or from which they can be popped, as in push down stacks. The most recently selected elements are compared in verification means 97. The verification means test whether the selected circuit component meets the type condition for the template element, and the connection pattern to earlier selected circuit elements in the selected circuit element buffer 96. When the test results in a success, a next template and circuit element are placed in the buffers 94, 96. When success is attained for the total number of circuit elements, a prespecified subcircuit has been found and the circuit element selection means will signal this.

When the comparison indicates failure, the circuit element selection means 95 cause the last selected circuit element to be popped from the selected circuit element buffer 97, and send a next circuit element to the buffer 96. If no new next circuit element is available, the circuit element selection means will cause the template element selection means 93 to pop a selected circuit element from its buffer 94. This process continues until a subcircuit is found or a persistent failure is met, which occurs when the template element buffer 94 becomes empty again.

The template element selection means 93, which are the main subject of the present invention, will select the initial template element under control of the counting means. It will also select further template elements according to any one of the weighting techniques described above. In this way, it will reduce the number of circuit components that the circuit component selection means 95 will need to push into its buffer 96 and then pop off again, and thus the time required before prespecified subcircuits are tracked down.

I claim:

1. A method of tracking down a prespecified subcircuit in an electrical circuit equivalent, the subcircuit being prespecified by a template circuit comprising a pattern of interconnections between interconnected template elements in the template circuit and associated type conditions for each interconnected template element, the method comprising the steps of counting, for each particular associated type condition, a respective occurrence rate of circuit elements in the electrical circuit equivalent which meet the type condition, selecting an initial template element which has a type condition corresponding to a lowest occurrence rate, selecting an initial circuit element meeting the type condition for the initial template element, searching, in the electrical circuit equivalent, for successive further circuit elements, interconnected to the initial circuit element according to the pattern and satisfying the type conditions for the template elements, until either all template elements are identified or persistent failure is met.

2. A method according to claim 1, further comprising the step of incrementally constructing a sequence of template elements, starting with the initial template element, which form a leading group of the identified elements, a succeeding template element in the sequence following the leading group in the sequence, being chosen under a restriction that, according to the pattern, it is interconnected to the leading group, and in that successively in the order of the sequence, for each template element an associated further circuit element is selected, meeting its associated type condition, and having an interconnection to a preceedingly selected circuit element according to the pattern.

3. A method according to claim 2 wherein, when said restriction leaves a choice, the choice of the succeeding template element is codetermined by its having lowest occurrence rate of corresponding circuit elements.

4. A method according to claim 3, further including the step of before choosing the succeeding template elements, readjusting the occurrence rate for the template elements by eliminating from said occurrence rate occurrences of identified elements and occurrences which are not connected to the further leading group.

5. A method according to claim 2, when said restriction leaves a choice, the choice of the succeeding template element is codetermined by choosing a template element having a highest connection count of connections in the pattern connecting the succeeding template element to the leading group.

6. A method according to claim 1 when said restriction leaves a choice, the choice of the succeeding template element is codetermined by choosing a template element having a lowest parallelism count of template elements which have identical type conditions as the template element for which the parallelism count is counted, and identical interconnections to the leading group in the pattern.

7. A method of constructing processing masks for fabrication of an electrical integrated semiconductor circuit, in which a chain of descriptions of an electrical circuit is generated, the chain including varying levels of descriptions of elements of the electrical circuit, said levels varying from high level descriptions to low level descriptions, starting with an initial description in terms of elements and their connections, for each description in said chain, replacing the elements by subcircuits which implement the respective functions of the elements, forming a layout description including patterns generated for the processing masks, and applying to the processing masks the patterns from the layout description for implementing said functions in the integrated circuit, the method comprising a feedback step for checking said replacement of elements, and on the basis of this checking correcting the replacement if necessary, the feedback step comprising starting from a selected level of said descriptions from said chain, generating a reconstructed description by substituting effective elements, representing subcircuits, for a group of elements and/or connections, said subcircuits matching templates which describe the effective elements, performing said checking by comparing the reconstructed description with a higher level description, which precedes the selected level of description in the sequence, and wherein detection of the occurrences of the subcircuits is performed according to claim 1.

8. A device for tracking down a prespecified subcircuit in an electrical circuit equivalent, the subcircuit being prespecified by a pattern of interconnections between interconnected template elements and respective type conditions for the interconnected template elements, the device comprising:

counting device for counting occurrence rates in the electrical circuit equivalent of circuit elements which meet the respective type conditions, a template element selecting device, with an input for receiving the occurrence rates, for selecting an initial template element which has a type condition which corresponds to a lowest occurrence rate, circuit element selecting device with an input for receiving the initial template element, for selecting an initial circuit element meeting the type condition for the initial template element, a searching device for successively searching for further circuit elements from the electrical circuit equivalent, which are connected to the initial circuit element according to the pattern and satisfying the respective type conditions.

\* \* \* \* \*